United States Patent [19]
Araki

[11] Patent Number: 5,658,812
[45] Date of Patent: Aug. 19, 1997

[54] NONVOLATILE SEMICONDUCTOR MEMORY DEVICE AND ITS MANUFACTURING METHOD

[75] Inventor: Yoshiko Araki, Kanagawa-ken, Japan

[73] Assignee: Kabushiki Kaisha Toshiba, Japan

[21] Appl. No.: 570,574

[22] Filed: Dec. 11, 1995

[30] Foreign Application Priority Data

Dec. 15, 1994 [JP] Japan .................................. 6-312018

[51] Int. Cl.$^6$ .................................................. H01L 21/8247
[52] U.S. Cl. ...................... 438/258; 438/588; 438/981; 438/453
[58] Field of Search ........................ 437/43, 46, 56, 437/57, 58, 979; 148/DIG. 126

[56] References Cited

U.S. PATENT DOCUMENTS

| | | | |
|---|---|---|---|
| 4,651,406 | 3/1987 | Shimizu et al. | 437/43 |
| 5,254,489 | 10/1993 | Nakata | 437/43 |
| 5,532,181 | 7/1996 | Takebuchi et al. | 437/979 |

Primary Examiner—Chandra Chaudhari
Attorney, Agent, or Firm—Banner & Witcoff, Ltd.

[57] ABSTRACT

The present invention aims to prevent the thickness of the element separation insulating film of the high voltage withstanding area from being thinned and reliability of the memory cell from being reduced. Element separation insulating films are formed on a surface of a silicon substrate. A silicon oxide film, serving as a gate insulating film of a high voltage withstanding area, is formed on the surface of the silicon substrate. A first polycrystalline silicon film is deposited on the oxide film and the element separation insulating films, and a first resist pattern is formed on the polycrystalline silicon film of the high voltage withstanding area and the low voltage withstanding area. The resist pattern is used as a mask to etch the polycrystalline silicon film. After separating the resist pattern, the silicon oxide film of the cell area is removed, and an oxide-nitride film, serving as a gate insulating film of the cell area is formed on the surface of the silicon substrate of the cell area. Therefore, it is possible to prevent the thickness of the element separation insulating film of high voltage withstanding area from being thinned and prevent reliability of the memory cell from being reduced.

14 Claims, 11 Drawing Sheets

NONVOLATILE SEMICONDUCTOR MEMORY DEVICE AND ITS MANUFACTURING METHOD

BACKGROUND OF THE INVENTION

1. Field of the Invention

The present invention relates to a nonvolatile semiconductor memory device which is operated by a plurality of power source voltages such as a voltage at the time of reading data like a nonvolatile semiconductor memory, and a higher voltage at the time of writing and erasing data, and its manufacturing method.

2. Description of the Related Arts

In a nonvolatile semiconductor memory device, data writing and erasing operations are performed by a high voltage. On the other hand, a nodal reading operation is performed by a low voltage as compared with the writing and erasing operations. Due to this, a thick gate insulating film, which can withstand a high voltage, is needed in the elements used in writing and erasing in order to ensure reliability. In contrast, since a lower voltage is needed in the elements used in reading, a thin gate insulating film may be used. Rather, there is a case in which the thin gate insulating film may be used in order to achieve a high performance such as a high speed operation.

Therefore, there is a case in which it is necessary to have two or more kinds of different thickness gate insulating films and element separation insulating films formed in one device.

FIGS. 28 to 32 are cross sectional views showing a conventional method for manufacturing a nonvolatile semiconductor memory device. This nonvolatile semiconductor memory device includes a high voltage withstanding transistor area (hereinafter called "high voltage withstanding area"), transistor areas other than the high voltage withstanding area ("low voltage withstanding area"), and a memory cell transistor area (hereinafter called "cell area").

First, as shown in FIG. 28, first to sixth element separation insulating films $2a$ to $2f$ are formed on a surface of a p type silicon substrate 1 having a cell area $1a$, a high voltage withstanding area $1b$ and a low voltage withstanding area $1c$. An oxide-nitride film 3 having a thickness of about 100 angstroms to serve as a gate insulating film of the cell area $1a$ is formed on the surface of the p type silicon substrate 1 positioned among these element separation insulating films $2a$ to $2f$. Thereafter, a first polycrystalline silicon film 4 is deposited on these element separation insulating films $2a$ to $2f$ and the oxide-nitride film 3.

Next, as shown in FIG. 29, a first resist pattern 5 is formed on the first polycrystalline silicon film 4. Thereafter, the first resist pattern 5 is used as a mask to perform etching, whereby the first polycrystalline silicon film 4 positioned on a floating gate separation area 6 of the cell area $1a$ is removed.

Thereafter, as shown in FIG. 30, the first resist pattern 5 is separated. Next, an ONO (oxide-nitride-oxide) layer film 7, serving as an insulating film between a control gate and a floating gate, is formed on a surface of said first polycrystalline silicon film 4.

Next, as shown in FIG. 31, a second resist pattern 8 is formed on the cell area $1a$. Thereafter, the resist pattern 8 is used as a mask to perform etching, whereby the ONO layer film 7 and the first polycrystalline silicon film 4 are removed. Next, the oxide-nitride film 3, which is positioned on each of the high voltage withstanding area $1b$ and the withstanding low voltage area $1c$, is etching-removed with $NH_4F$, thereby exposing the surface of the p type silicon substrate 1.

Thereafter, as shown in FIG. 32, the second resist pattern 8 is separated. Next, an oxide film 9 having a thickness of about 250 angstroms to serve as a gate insulating film of the high voltage withstanding area $1b$ is formed on the surface of the exposed p type silicon substrate 1.

Thereafter, a second polycrystalline silicon film 10 is deposited on each of the ONO layer film 7, the third to sixth element separation insulating films, and the oxide film 9.

In the above-mentioned conventional nonvolatile semiconductor memory device and its manufacturing method, the third and fourth element separation insulating films $2c$ and $2d$, which are positioned at the high voltage withstanding area $1b$, become thin. This is because the third and fourth element separation insulating films $2c$ and $2d$ are simultaneously etched when the oxide-nitride film 3 is etched as shown in FIG. 31. As a result, a reverse field voltage is lowered in the third and fourth element separation insulating films $2c$ and $2d$, and there occurs a problem in providing a required high withstanding voltage to the high voltage withstanding area $1b$.

As a method for preventing the reverse field voltage from being lowered, it can be considered that thick impurity material is implanted to the p type silicon substrate 1, which is positioned just under the third and fourth element separation insulating films $2c$ and $2d$. However if this method is used in a minute element, deterioration of the narrow channel effect of the transistor occurs by exudation of impurity material, and a reduction of withstanding voltage of the surface of the high voltage withstanding element occurs. Therefore, the above-mentioned problem cannot be solved by this method.

Moreover, in the process of exposing the surface of the p type silicon substrate 1 of each of the high voltage withstanding area $1b$ and the low voltage withstanding area $1c$, as shown in FIG. 31, the second resist pattern 8 is directly formed on the ONO layer 7 film of the cell area $1a$. Due to this, the ONO layer film 7 is polluted by the resist, and the film quality of the ONO layer film 7 is deteriorated. Due to the polluted ONO layer film 7, there are problems in insulation breakage of the nonvolatile semiconductor memory device and deterioration of data storing characteristics. As a result, reliability of the memory cell is lowered.

Furthermore, since the oxide nitride film 3 is used as a gate insulating film of the memory cell transistor in accordance with a requirement for high voltage withstanding and high reliability, a white ribbon (SiN), which is not fully removed, is left on the surface of the p type silicon substrate 1 of each of the high voltage withstanding area $1b$ and the low voltage withstanding area $1c$ when the film 3 is etching-removed. The white ribbon becomes a problem particularly in the high voltage withstanding area $1b$. More specifically, by the white ribbon, as shown in FIG. 32, the withstanding voltage of the gate insulating film 9 formed in the high voltage withstanding $1b$ is deteriorated, and breakage of the insulating film is caused when the high voltage is applied to the gate insulating film 9. Then, reduction of yield occurs.

SUMMARY OF THE INVENTION

In consideration of the above-mentioned problems, the present invention has been made, and an object of the present invention is to provide a nonvolatile semiconductor memory device and manufacturing method in which both thinning of the thickness of an element separation insulating film of a high voltage withstanding area and a reduction of reliability of a memory cell are prevented.

In order to solve the above problems, the present invention includes a first element separation insulating film for separating an area forming a first MOS transistor where a first power voltage is applied and a second element separation insulating film for separating an area forming a second MOS transistor where a second power voltage higher than the first power voltage is applied, and having a thickness larger than the thickness of the first element separation insulating film.

Moreover, the present invention includes a first polycrystalline silicon film for forming a part of a gate electrode in a first MOS transistor where a first power voltage is applied, and a second polycrystalline silicon film for forming a part of a gate electrode in a second MOS transistor where a second power voltage higher than the first power voltage is applied, having a thickness larger than the thickness of the first polycrystalline silicon film.

Furthermore, various embodiments of the present invention include the steps of: forming, on a surface of a semiconductor substrate, a first element separation insulating film for separating a first area forming a first MOS transistor where a first power voltage is applied, a second element separation insulating film for separating a second area forming a second MOS transistor where a second power voltage higher than the first power voltage is applied, and a third element separation insulating film for separating a third area forming a memory cell transistor; forming a first oxide film serving as a gate insulating film of the second MOS transistor on the surface of the semiconductor substrate; depositing a first polycrystalline silicon film on the first oxide film and the first to third element separation insulating films; forming a first resist pattern on the first polycrystalline silicon film of each of the first and second areas; etching the first polycrystalline silicon film of the third area using the first resist pattern as a mask; removing the first oxide film from the third area after separating the first resist pattern; forming a second oxide film, serving as a gate insulating film of the memory cell transistor, on a surface of the semiconductor substrate on the third area; depositing a second polycrystalline silicon film, serving as a floating gate of the memory cell transistor, on the second oxide film; introducing impurity material to the second polycrystalline silicon film; forming a second resist pattern on the second polycrystalline silicon film on an area of each of the second and third areas where a floating gate electrode is formed; etching the second polycrystalline silicon film using the second resist pattern as a mask; forming a first insulating film serving as an insulating film between a floating gate of the memory cell transistor and a control gate, on the second polycrystalline silicon film after separating the second resist pattern; depositing a third polycrystalline silicon film on the first insulating film; forming a third resist pattern on the third polycrystalline silicon film on the third area; etching the third polycrystalline silicon film from the first and second areas using the third resist pattern as a mask; etching the first insulating film of the first and second areas using the third resist pattern as a mask; etching the first polycrystalline silicon film from the first area and the second polycrystalline silicon film on the second area using the third resist pattern as a mask; etching the first oxide film from the first area after separating the third resist pattern; forming a third oxide film, serving as a gate insulating film of the first MOS transistor, on a surface of the semiconductor substrate on the first area on a surface of the first polycrystalline silicon film on the second area, and on a surface of the third polycrystalline silicon film on the third area; depositing a fourth polycrystalline silicon film on the third oxide film; forming a fourth resist pattern on the fourth polycrystalline silicon film of the first area; etching the fourth polycrystalline silicon film using the fourth resist pattern as a mask; and depositing a fifth polycrystalline silicon film on the first to third areas after separating the fourth resist pattern.

Furthermore, various embodiments of the present invention include the steps of: forming on a surface of a semiconductor substrate, a first element separation insulating film for separating a first area forming a first MOS transistor where a first power voltage is applied, a second element separation insulating film for separating a second area forming a second MOS transistor where a second power voltage higher than the first power voltage is applied, and a third element separation insulating film for separating a third area forming a memory cell transistor; forming a first oxide film, serving as a gate insulating film of the second MOS transistor, on a surface of the semiconductor substrate; depositing a first polycrystalline silicon film on the first oxide film and the first to third element separation insulating films; forming an oxide film on the first polycrystalline silicon film; forming a first resist pattern on the oxide film on each of the first and second areas; etching the oxide film and the first polycrystalline silicon film using the first resist pattern as a mask; removing the first oxide film from the third area after separating the first resist pattern; forming a second oxide film, serving as a gate insulating film of the memory cell transistor, on a surface of the semiconductor substrate of the third area; depositing a second polycrystalline silicon film, serving as a floating gate of the memory cell transistor, on the second oxide film; introducing impurity material to the second polycrystalline silicon film; forming a second resist pattern on the second polycrystalline silicon on the third area where the floating gate electrode is formed and on the second area; etching the second polycrystalline silicon film using the second resist pattern as a mask; forming a first insulating film, serving as an insulating film between the floating gate of the memory cell transistor and a control gate, on the second polycrystalline silicon film after separating the second resist pattern; depositing a third polycrystalline silicon film on the first insulating film; forming a third resist pattern on the third polycrystalline silicon film on the third area; etching the third polycrystalline silicon film from the first and second areas using the third resist pattern as a mask; etching the first insulating film of the first and second areas using the third resist pattern as a mask; etching the first polycrystalline silicon film from the first area and the second polycrystalline silicon film of the second area in a state that the third resist pattern is used as a mask; and introducing impurity material to the semiconductor substrate using the third resist pattern.

Furthermore, various embodiments of the present invention include the steps of: forming, on a surface of a semiconductor substrate, a first element separation insulating film for separating a first area forming a first MOS transistor where a first power voltage is applied, a second element separation insulating film for separating a second area forming a second MOS transistor where a second power voltage higher than the first power voltage is applied, and a third element separation insulating film for separating a third area forming a memory cell transistor; forming a first oxide film, serving as a gate insulating film of the second MOS transistor, on a surface of the semiconductor substrate; depositing a first polycrystalline silicon film having a thickness sufficient for a mask, when introducing impurity material to the semiconductor substrate of the first area in a later process, on the first oxide film and the first to third element separation insulating film; forming a first resist pattern on the oxide film of each of the first and second areas; etching the first polycrystalline silicon film using the first resist pattern as a mask; removing the first oxide film of the third area after separating the first resist pattern; forming a second oxide film, serving as a gate insulating film of the memory cell transistor, on a surface of the semiconductor substrate on the third area; depositing a second polycrystalline silicon film, serving as a floating gate of the memory cell transistor, on the second film; introducing impurity material into the second polycrystalline silicon film; forming a second resist pattern on the second polycrystalline silicon film on the third area where a floating gate electrode is formed and on the second area; etching the second polycrystalline silicon film using the second resist pattern as a mask; forming a first insulating film, serving as an insulating film between a floating gate of the memory cell transistor and a control gate, on the second polycrystalline silicon film after separating the second resist pattern; depositing a third polycrystalline silicon film on the first insulating film; forming a third resist pattern on the third polycrystalline silicon film on the third area; etching the third polycrystalline silicon film from the first and second areas using the third resist pattern as a mask; etching the first insulating film from the first and second areas using the third resist pattern as a mask; using the third resist pattern, the first polycrystalline silicon film, and the silicon oxide film as a mask to introduce impurities into the first area; and etching the first polycrystalline silicon film from the first area and the second polycrystalline silicon film of the second area using the third resist pattern as a mask.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENT

Embodiments of the present invention will be described below in detail, with reference being made to the accompanying drawings.

FIGS. 1 to 13 are cross sectional views showing a method for manufacturing a nonvolatile semiconductor memory device of a first embodiment of the present invention. This nonvolatile semiconductor memory device is a flash EEPROM in which an area having a high voltage withstanding MOS transistor to which high voltage (e.g., 12 v) is applied at the time of writing and erasing (hereinafter called "high voltage withstanding area"), an area having other MOS transistors to which no high voltage (e.g., 5–3.3 v) is applied (hereinafter called "low voltage withstanding area"), and an area where a memory cell transistor is formed which, e.g., 10 v is applied when writing and erasing mode, 3 v is applied when reading mode (hereinafter called "cell area") are provided (hereinafter called as "cell area") on the same substrate.

Figure 1:
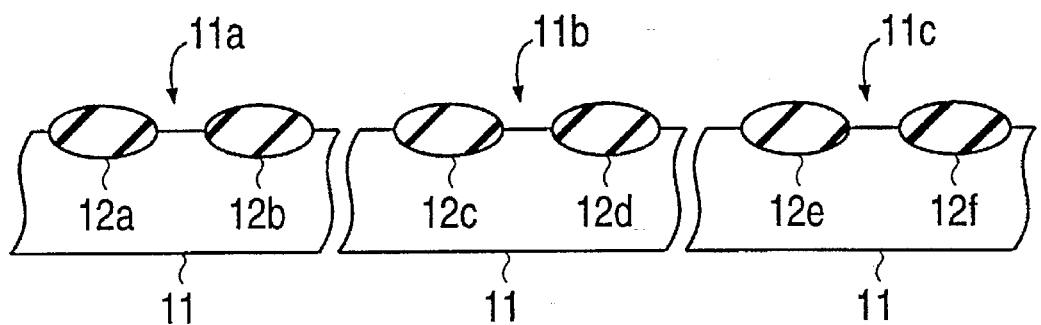
FIG. 1 is a cross sectional view showing a method for manufacturing a nonvolatile semiconductor memory device of a first, second, or third embodiment of the present invention.

First, as shown in FIG. 1, first to sixth element separation insulating films 12a to 12f are formed on a surface of a p type silicon substrate 11 having a cell area 11a, a high voltage withstanding area 11b, and a low voltage withstanding area 11c.

Figure 2:
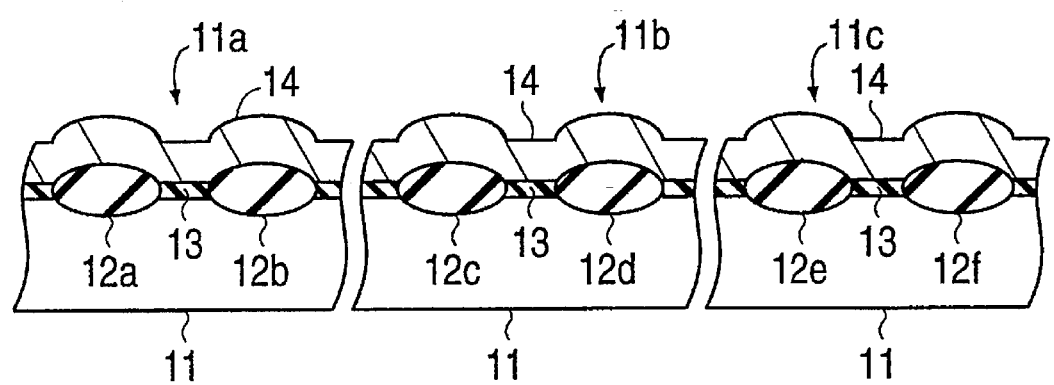
FIG. 2 shows a method for manufacturing a nonvolatile semiconductor memory device of the first or third embodiment of the present invention, and is a cross sectional view showing a process next to FIG. 1.

As shown in FIG. 2, a silicon oxide film 13, serving as a gate insulating film of the high voltage withstanding area 11b and having a thickness of about 250 angstroms, is formed on the surface of the p type silicon substrate 11 positioned among first to sixth separation insulating films 12a to 12f.

Thereafter, a first polycrystalline silicon film 14 having a thickness of about 1000 angstroms is deposited on the first to sixth element separation insulating films 12a to 12f and the silicon oxide film 13 by LPCVD.

Figure 3:
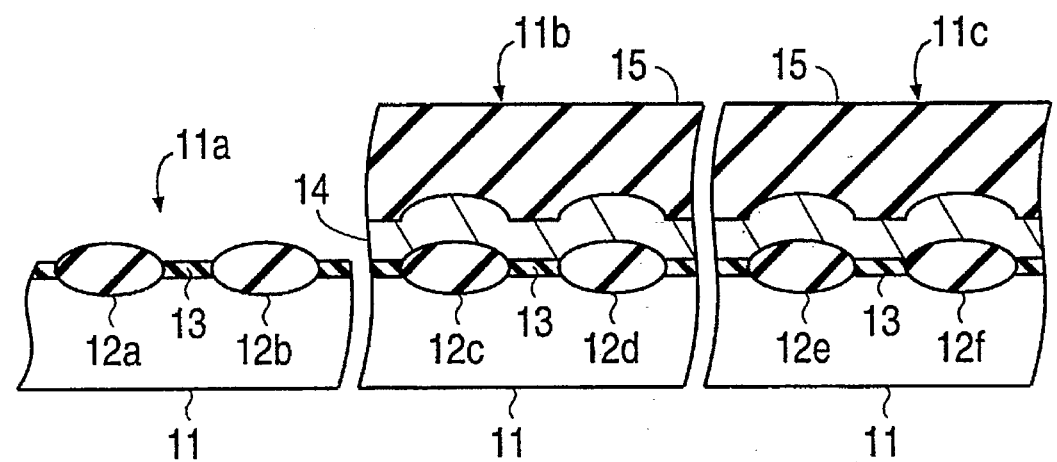
FIG. 3 shows a method for manufacturing a nonvolatile semiconductor memory device of the first embodiment of the present invention, and is a cross sectional view showing a process next to FIG. 2.

Thereafter, as shown in FIG. 3, a first resist pattern 15 is formed on the first polycrystalline silicon film 14 by lithography, and the resist is positioned on each of the high voltage withstanding area 11b, and the low voltage withstanding area 11c. Then, the first resist pattern 15 is used as a mask to perform isotropic etching, thereby removing the first polycrystalline silicon film 14 from the cell area 11a.

Figure 4:
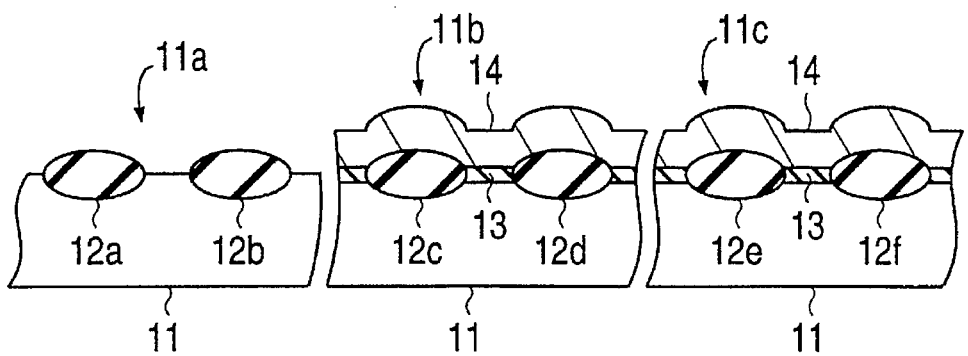
FIG. 4 shows a method for manufacturing a nonvolatile semiconductor memory device of the first embodiment of the present invention, and is a cross sectional view showing a process next to FIG. 3.

Next, as shown in FIG. 4, the first resist pattern 15 is removed. Thereafter, the silicon oxide film 13 is removed from the cell area 11a by etching using $NH_4F$, thereby exposing a surface of the p type silicon substrate 11.

Figure 5:
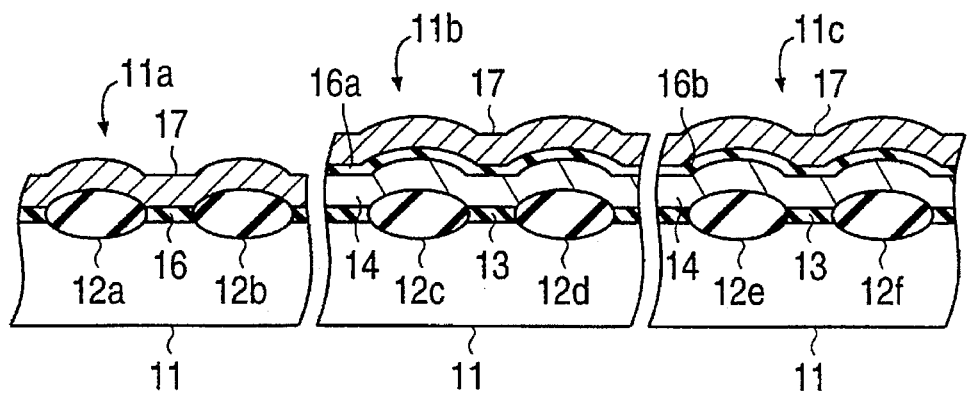
FIG. 5 shows a method for manufacturing a nonvolatile semiconductor memory device of the first embodiment of the present invention, and is a cross sectional view showing a process next to FIG. 4.

Thereafter, as shown in FIG. 5, an oxide-nitride film 16 having a thickness of about 100 angstroms to serve as a gate insulating film of the cell area 11a is formed on the surface of the exposed p type silicon substrate 11. At this time, an oxide-nitride film 16a is formed on the first polycrystalline silicon film 14 of the high voltage withstanding area 11b, and an oxide-nitride film 16b is formed on the first polycrystalline silicon film 14 of the low voltage withstanding area 11c. Then, a second polycrystalline silicon film 17 having a thickness of about 1000 angstroms to serve as a floating gate of the cell area 11a is deposited on the oxide-nitride films 16, 16a, and 16b, and the first and second element separation insulating films 12a and 12b. Thereafter, phosphorus is doped to the second polycrystalline silicon film 17 by phosphorus diffusion.

Figure 6:
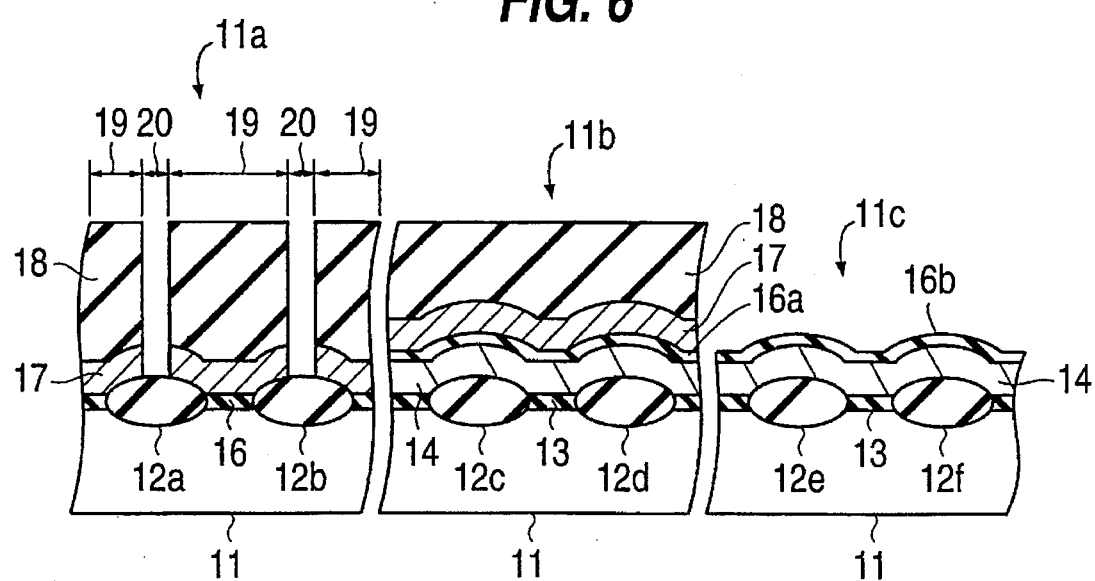
FIG. 6 shows a method for manufacturing a nonvolatile semiconductor memory device of the first embodiment of the present invention, and is a cross sectional view showing a process next to FIG. 5.

Then, as shown in FIG. 6, a second resist pattern 18 is formed on the second polycrystalline silicon film 17. The second resist pattern 18 is positioned at an area 19 where the floating gate of the cell transistor is formed and on the high voltage withstanding area 11b. Thereafter, the second resist pattern 18 is used as a mask to perform etching, whereby the second polycrystalline silicon film 17 on each of a floating gate separation area 20 of the cell area 11a and the low voltage withstanding area 11c is removed.

Figure 7:
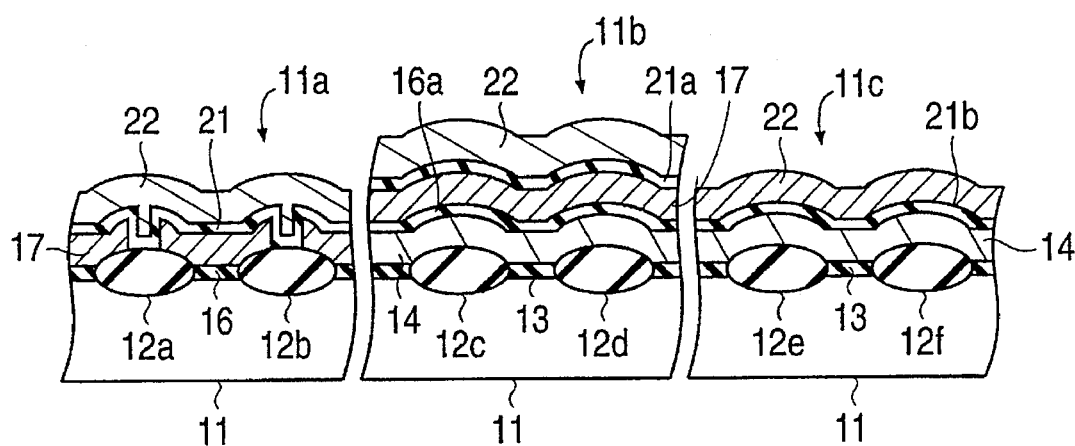
FIG. 7 shows a method for manufacturing a nonvolatile semiconductor memory device of the first embodiment of the present invention, and is a cross sectional view showing a process next to FIG. 6.

Thereafter, as shown in FIG. 7, the second resist pattern 18 is removed. Then, as an insulating film between the floating gate of the cell transistor and a control gate, for example, an ONO (oxide-nitride-oxide) layer film 21 is formed on the second polycrystalline silicon film 17 of the cell area 11a. At this time, an ONO layer film 21a is formed on the second polycrystalline silicon film 17 of the high voltage withstanding area 11b, and an ONO layer film 21b is formed on the first polycrystalline silicon film 14 of the low voltage withstanding area 11c. Thereafter, a third polycrystalline silicon film 22 having a thickness about 1000 angstroms is deposited on the ONO layer films 21, 21a and 21b.

Figure 8:
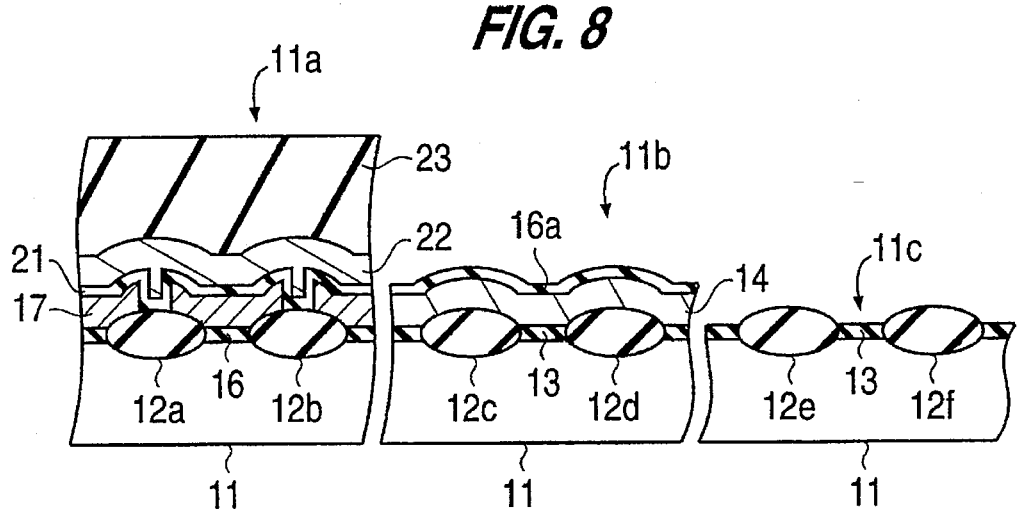
FIG. 8 shows a method for manufacturing a nonvolatile semiconductor memory device of the first embodiment of the present invention, and is a cross sectional view showing a process next to FIG. 7.

Next, as shown in FIG. 8, a third resist pattern 23 is formed on a third polycrystalline silicon film 22 of the cell area 11a. Thereafter, the resist pattern 23 is used as a mask to perform isotropic etching, so that the third polycrystalline silicon films 22 of the high voltage withstanding area 11b and the low voltage withstanding area 11c are simultaneously removed.

Next, the third resist pattern 23 is used as a mask to perform anisotropic etching, thereby removing the ONO layer films 21a and 21b. Thereafter, the resist pattern 23 is used as a mask to perform etching, so that the second polycrystalline silicon film 17 of the high voltage withstanding area 11b and the first polycrystalline silicon film 14 of the low voltage withstanding area 11c are simultaneously removed.

Figure 9:
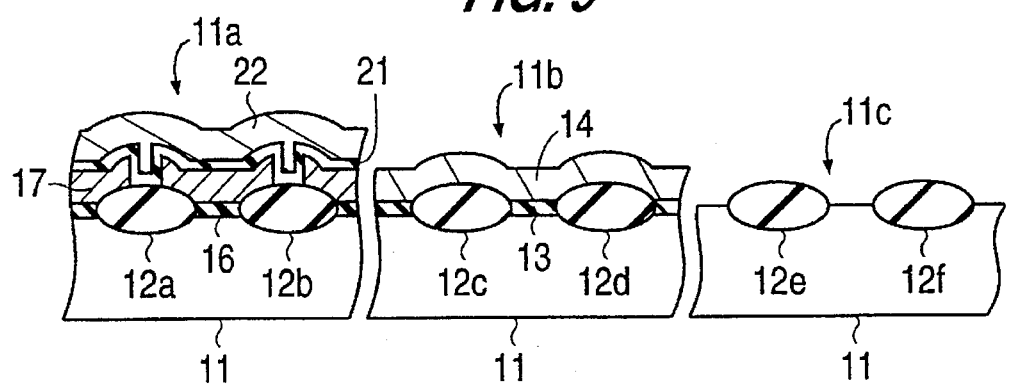
FIG. 9 shows a method for manufacturing a nonvolatile semiconductor memory device of the first embodiment of the present invention, and is a cross sectional view showing a process next to FIG. 8.

Thereafter, as shown in FIG. 9, the third resist pattern 23 is removed. The oxide-nitride film 16a and the silicon oxide film 13 of the low voltage withstanding area 11c are removed by etching with NH₄F, thereby exposing the surface of the p type silicon substrate 11 of the low voltage withstanding area 11c.

Figure 10:
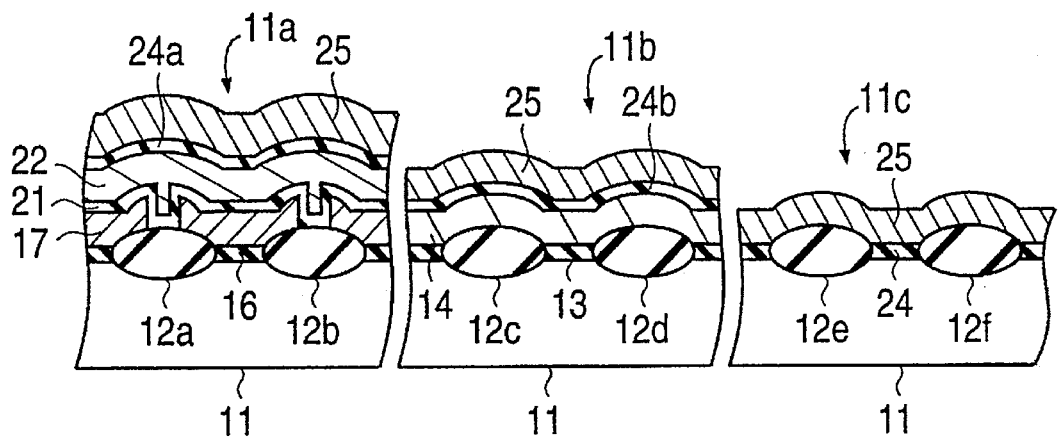
FIG. 10 shows a method for manufacturing a nonvolatile semiconductor memory device of the first embodiment of the present invention, and is a cross sectional view showing a process next to FIG. 9.

Next, as shown in FIG. 10, a silicon oxide film 24 having a thickness of about 120 angstroms to be used as a gate insulating film of a low voltage withstanding element is formed on the surface of the exposed p type silicon substrate 11. At this time, a silicon oxide film 24a is formed on the third polycrystalline silicon film 22 of the cell area 11a, and a silicon oxide film 24b is formed on the first polycrystalline silicon film 14 of the high voltage withstanding area 11b.

Thereafter, a fourth polycrystalline silicon film 25 having a thickness about 1000 angstroms is deposited on the silicon oxide films 24, 24a and 24b and the fifth and sixth element separation insulating films 12e and 12f.

Figure 11:
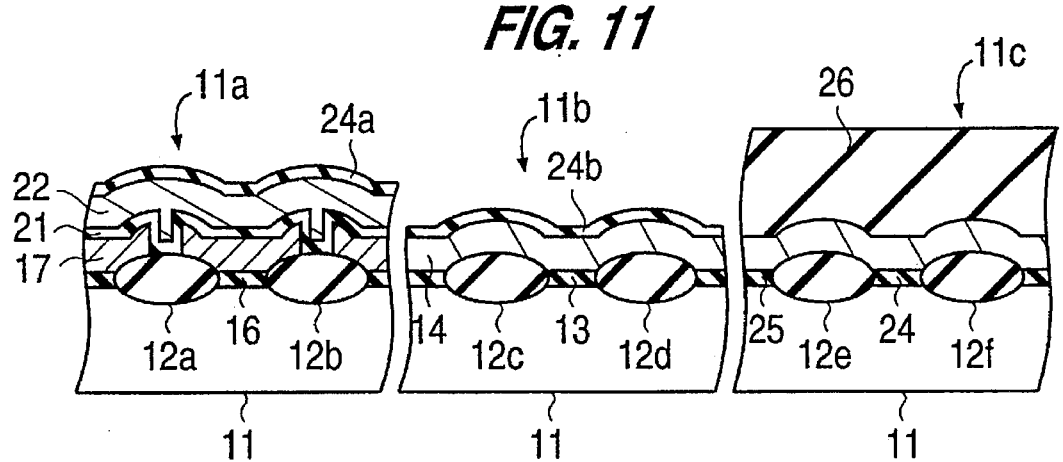
FIG. 11 shows a method for manufacturing a nonvolatile semiconductor memory device of the first embodiment of the present invention, and is a cross sectional view showing a process next to FIG. 10.

Thereafter, as shown in FIG. 11, a fourth resist pattern 26 is formed on the fourth polycrystalline film 25 of the low voltage withstanding area 11c. Next, the resist pattern 25 is used as a mask to perform isotropic etching, whereby the fourth polycrystalline silicon films 25 of the cell area 11a and the high voltage withstanding area 11b are removed, respectively.

Figure 12:
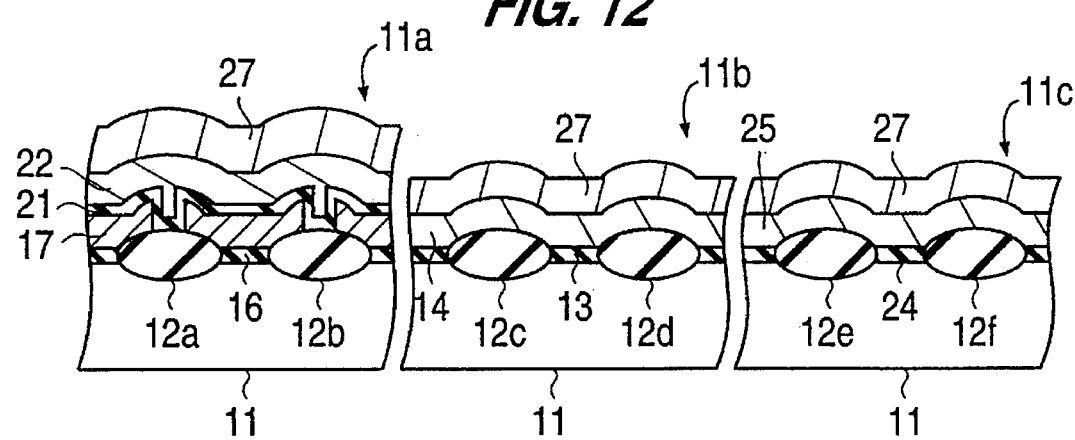
FIG. 12 shows a method for manufacturing a nonvolatile semiconductor memory device of the first embodiment of the present invention, and is a cross sectional view showing a process next to FIG. 11.

Thereafter, as shown in FIG. 12, the fourth resist pattern 26 is separated. Thereafter, the silicon oxide films 24a and 24b are separated with NH₄F. Next, a fifth polycrystalline silicon film 27 is deposited on the first, third, and fourth polycrystalline silicon films 14, 22, 25.

By a polycrystalline silicon film 27, the cell area 11a, the withstanding high voltage area 11b, and the low voltage withstanding area 11c are connected.

Thereafter, the third and fifth polycrystalline silicon films 22 and 27 of the cell area 11, the first and fifth polycrystalline silicon films 14 and 27 of the high voltage withstanding area 11b and the fourth and fifth polycrystalline silicon films 25 and 27 of the low voltage withstanding area 11c are respectively doped by phosphorus diffusion.

Figure 13:
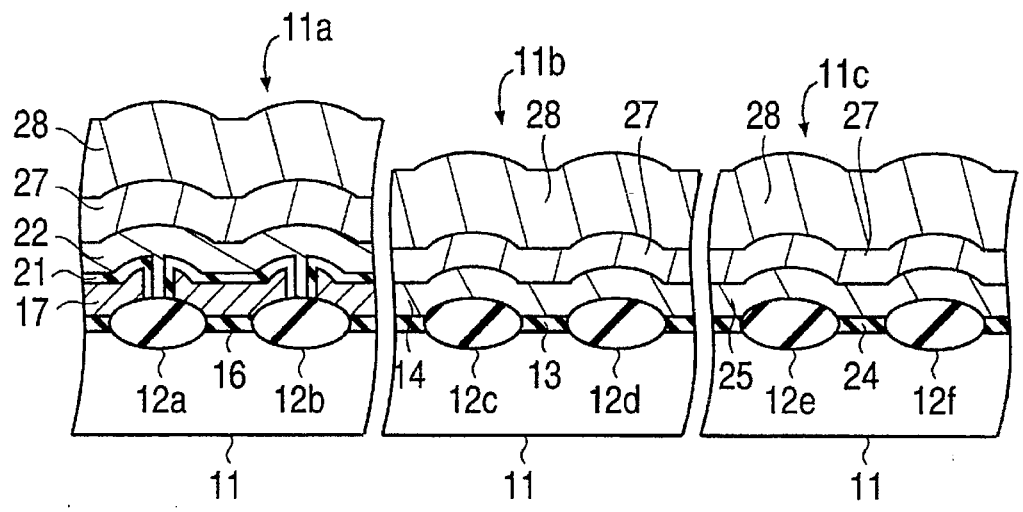
FIG. 13 shows a method for manufacturing a nonvolatile semiconductor memory device of the first embodiment of the present invention, and is a cross sectional view showing a process next to FIG. 12.

Thereafter, as shown in FIG. 13, a tungsten silicide film 28 is formed on the fifth polycrystalline silicon film 27 by sputtering. Next, a gate electrode of the transistor is processed. Thereafter, an interlayer insulating film is formed by the same method as the manufacturing method of a conventional MOS integrated circuit. Next, a metallic wiring is formed, and thereafter, a passivation film is formed.

According to the first embodiment, the gate insulating film 13 of the high voltage withstanding area 11b is first formed, and the gate insulating film 16 of the cell area 11a is next formed.

In other words, first, the gate insulating film 13 of the high voltage withstanding area 11b is formed on the surface of the p type silicon substrate 11. Then, the first polycrystalline silicon film 14 is formed on the gate insulating film 13 and the third to sixth element separation insulating films 12c to 12f.

Then, the polycrystalline silicon film 14 is used as a mask, and the silicon oxide film 13 of the cell area 11a is removed by etching with NH₄F. Due to this, in removing by etching with NH₄F, the third and fourth element separation insulating films 12c and 12d are not etched with NH₄F.

Therefore, since the element separation insulating films 12c and 12d of the high voltage withstanding area 11b are not thinned, there is not a problem in which a reverse field voltage is lowered, and a required high voltage can be provided to the high voltage withstanding area 11b.

Also, the ONO layer film layer 21, which is used as an insulating film between the floating gate of the cell transistor and the control gate of the cell transistor is formed. Thereafter, the third polycrystalline silicon film 22 is continuously deposited on the ONO layer film 21, and the third resist pattern 23 is formed on the polycrystalline silicon film 22.

Due to this, unlike the conventional manufacturing method, the resist is not directly applied onto the ONO layer film 21. Therefore, the ONO layer film 21 is not polluted by the resist, and the film quality of the ONO layer film 21 is not deteriorated. As a result, insulation breakage of the nonvolatile semiconductor memory device, and the deterioration of data storing characteristics can be prevented. Also, reliability of the memory cell can be improved.

Also, unlike the conventional manufacturing method, the gate insulating film of the high voltage withstanding area is not formed after forming the gate insulating film of the cell area. First, the gate insulating film 13 of the high voltage withstanding area 11b is formed. Thereafter, the gate insulating film 16 of the cell area 11a is formed. Due to this, the process of separating the oxide-nitride-oxide film for the p type silicon substrate 11 in the high voltage withstanding area 11b is not needed. As a result, unlike the conventional manufacturing method, no white ribbon is left on the surface of the p type silicon substrate 11 of the high voltage withstanding area 11b. Therefore, voltage resistance to the gate insulating film of the high voltage withstanding area 11b is not deteriorated, and the reduction of yield due to the insulation breakage can be prevented.

Moreover, in order to control a threshold value of the transistor of the low voltage withstanding area 11c as required, impurity material can be introduced without providing a process of forming a new photoresist. In other words, after the process of etch-removing the silicon oxide film 13 and the oxide-nitride film 16a shown in FIG. 8, if impurity material is implanted to the p type silicon substrate 11 using that the third resist pattern 23 of the cell area 11a and the first polycrystalline silicon film 14 of the high voltage withstanding area 11b are used as masks, impurity material can be introduced to only the p type silicon substrate 11 of the low voltage withstanding area 11c. Therefore, it is possible to constitute a transistor, which is suitable for obtaining miniaturization and high performance, and increases in the manufacturing cost may be low.

In the above-mentioned first embodiment, an oxide-nitride film 16 having a good film quality as a gate insulating film is used as a gate insulating film in the cell area 11a. However, a silicon oxide film can be used as a gate insulating film in the cell area 11a. If oxide-nitride film 16 is used as a gate insulating film, leakage current in the low voltage area can be reduced. In terms of this point, reliability of the device can be improved. In contrast, if the silicon oxide film is used as a gate insulating film, stress between the element separation insulating films formed of the silicon oxide film can be relaxed. In terms of this point, reliability of the device can be improved.

FIG. 1 and FIGS. 14 to 20 are cross sectional views showing a method for manufacturing a nonvolatile semiconductor memory device of a second embodiment of the present invention. The same reference numerals are added to the portions common to the first embodiment.

Figure 14:
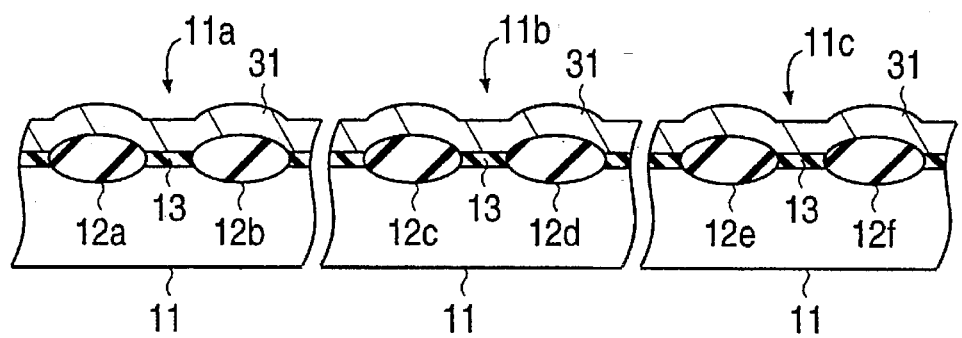
FIG. 14 shows a method for manufacturing a nonvolatile semiconductor memory device of the second embodiment of the present invention, and is a cross sectional view showing a process next to FIG. 1.

First, after the process shown in FIG. 1, as shown in FIG. 14, a silicon oxide film 13, serving as a gate insulating film of the high voltage withstanding area 11b and having a thickness of about 250 angstroms, is formed on the surface of the p type silicon substrate 11 positioned among first to sixth separation insulating films 12a to 12f.

Thereafter, a first polycrystalline silicon film 31 having a thickness of about 1200 angstroms is deposited on the first to sixth element separation insulating films 12a to 12f and the silicon oxide film 13 by LPCVD. The first polycrystalline silicon film 31 constitutes the gate electrode.

Figure 15:
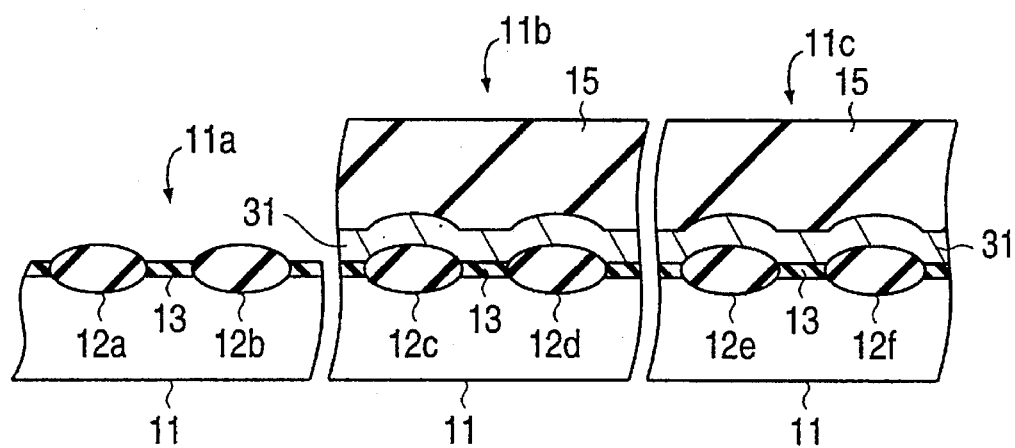
FIG. 15 shows a method for manufacturing a nonvolatile semiconductor memory device of the second embodiment of the present Invention, and is a cross sectional view showing a process next to FIG. 14.

Next, as shown in FIG. 15, a first resist pattern 15 is formed on the first polycrystalline silicon film 31 by lithography, and the resist is positioned on each of the high voltage withstanding area 11b, and the low voltage withstanding area 11c. Then, the first resist pattern 15 is used as a mask to perform isotropic etching, thereby removing the first polycrystalline silicon film 31 from the cell area 11a.

Figure 16:
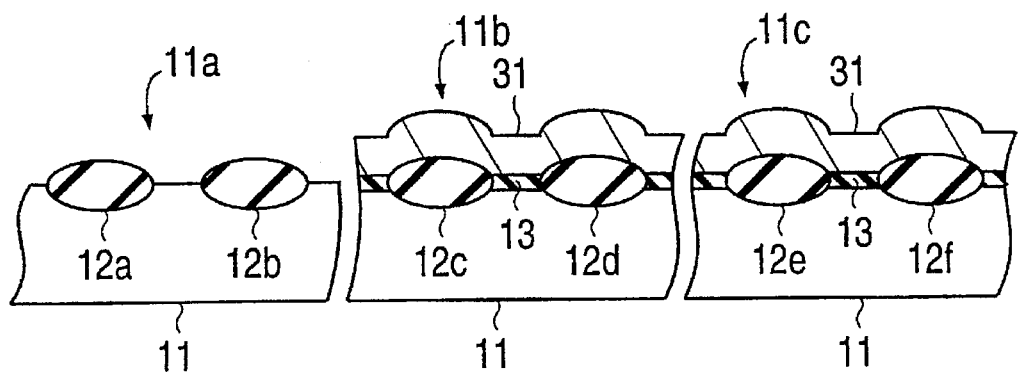
FIG. 16 shows a method for manufacturing a nonvolatile semiconductor memory device of the second embodiment of the present invention, and is cross sectional view showing a process next to FIG. 15.

Thereafter, as shown in FIG. 16, the first resist pattern is removed. Thereafter, the silicon oxide film 13 is removed from the cell area 11a by etching using $NH_4F$, thereby exposing a surface of the p type silicon substrate 11.

Figure 17:
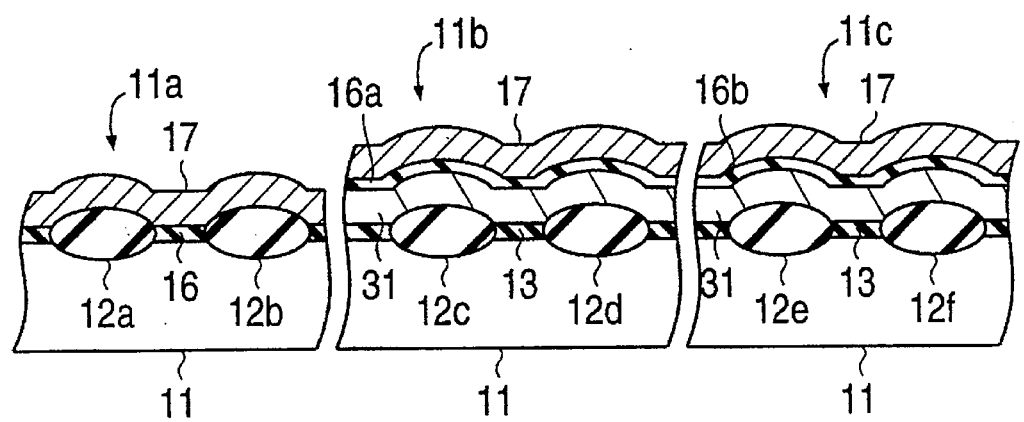
FIG. 17 shows a method for manufacturing a nonvolatile semiconductor memory device of the second embodiment of the present invention, and is a cross sectional view showing a process next to FIG. 16.

As shown in FIG. 17, an oxide-nitride film 16 having a thickness of about 100 angstroms to serve as a gate insulating film of the cell area 11a is formed on the surface of the exposed p type silicon substrate 11. At this time, the oxide-nitride film 16a is formed on the first polycrystalline silicon film 31 of the high voltage withstanding area 11b, and the oxide-nitride film 16b is formed on the first polycrystalline silicon film 31 of the low voltage withstanding area 11c. Then, the second polycrystalline silicon film 17 having a thickness of about 1000 angstroms to serve as a floating gate of the cell area 11a is deposited on the oxide-nitride films 16, 16a, and 16b, and the first and second element separation insulating films 12a and 12b. Thereafter, phosphorus is doped to the second polycrystalline silicon film 17 by phosphorus diffusion.

Figure 18:
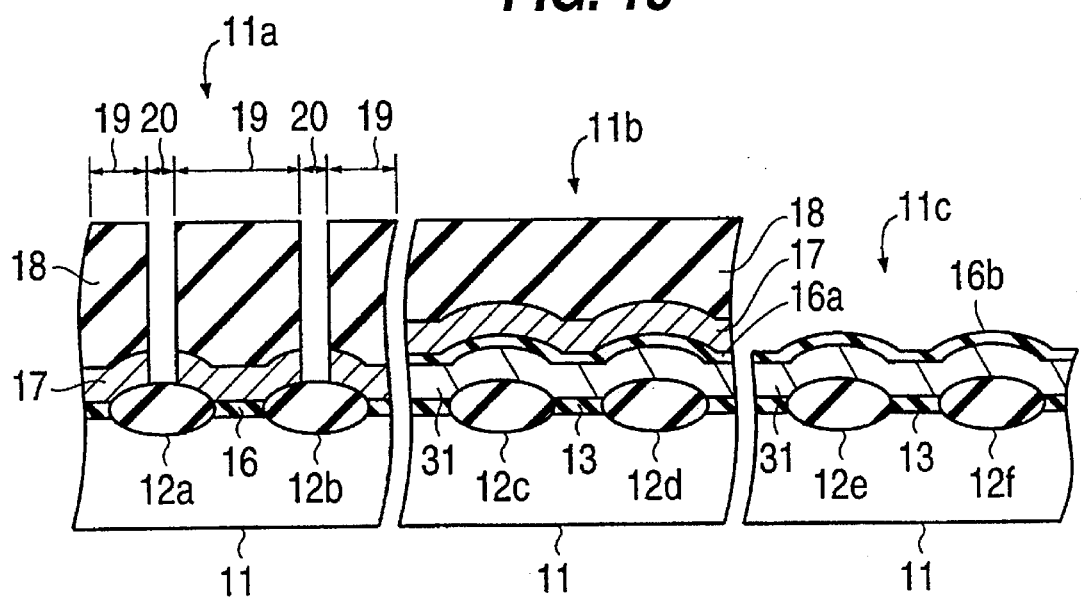
FIG. 18 shows a method for manufacturing a nonvolatile semiconductor memory device of the second embodiment of the present invention, and is a cross sectional view showing a process next to FIG. 17.

Thereafter, as shown in FIG. 18, a second resist pattern 18 is formed on the second polycrystalline silicon film 17. The second resist pattern 18 is positioned at the area 19 where the floating gate of the cell transistor is formed and on the high voltage withstanding area 11b. Thereafter, the second resist pattern 18 is used as a mask to perform etching, whereby the second polycrystalline silicon film 17 on each of a floating gate separation area 20 of the cell area 11a and the low voltage withstanding area 11c is removed.

Figure 19:
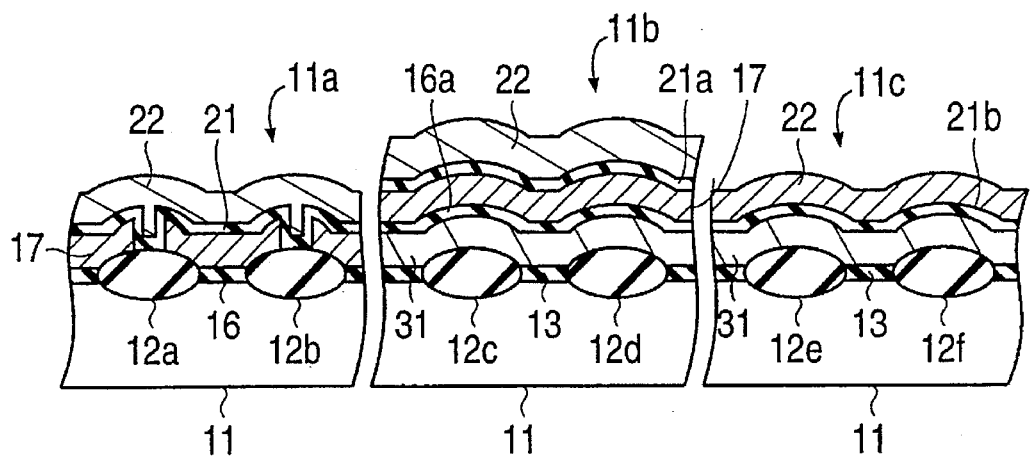
FIG. 19 shows a method for manufacturing a nonvolatile semiconductor memory device of the second embodiment of the present invention, and is a cross sectional view showing a process next to FIG. 18.

Next, as shown in FIG. 19, the second resist pattern 18 is removed. Then, as an insulating film between the floating gate of the cell transistor and the control gate of the cell transistor, for example, an ONO (oxide-nitride-oxide) layer film 21 is formed on the second polycrystalline silicon film 17 of the cell area 11a. At this time, the ONO layer film 21a is formed on the second polycrystalline silicon film 17 of the high voltage withstanding area 11b, and the ONO layer film 21b is formed on the first polycrystalline silicon film 14 of the low voltage withstanding area 11c. Thereafter, a third polycrystalline silicon film 22 having a thickness about 1000 angstroms is deposited on the ONO layer films 21, 21a and 21b.

Figure 20:
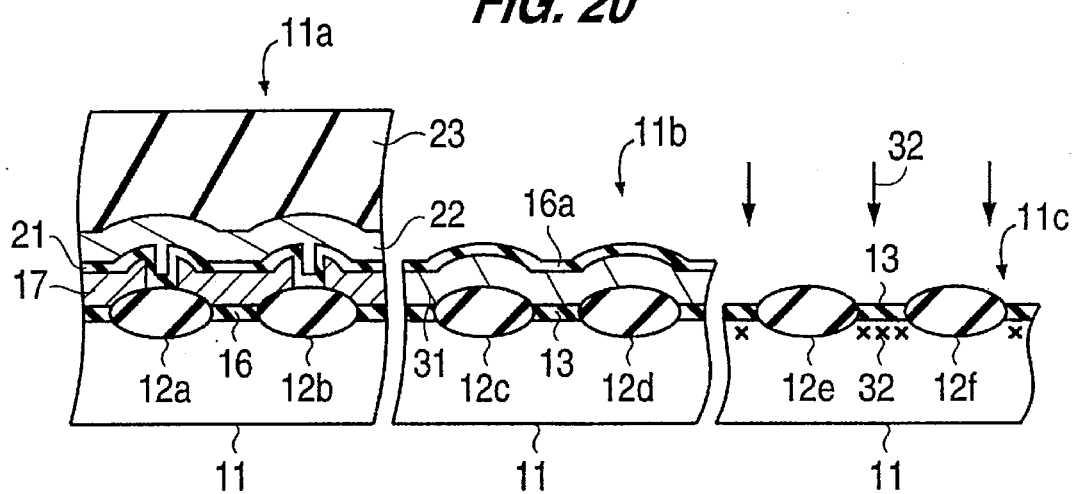
FIG. 20 shows a method for manufacturing a nonvolatile semiconductor memory device of the second embodiment of the present invention, and is a cross sectional view showing a process next to FIG. 19.

Thereafter, as shown in FIG. 20, a third resist pattern 23 is formed on the third polycrystalline silicon film 22 of the cell area 11a. Thereafter, the resist pattern 23 is used as a mask to perform isotropic etching, so that the third polycrystalline silicon films 22 of the high voltage withstanding area 11b and the low voltage withstanding area 11c are simultaneously removed.

Next, the third resist pattern 23 is used as a mask to perform anisotropic etching, thereby removing the ONO layer films 21a and 21b. Thereafter, the resist pattern 23 is used as a mask to perform etching, so that the second polycrystalline silicon film 17 of the high voltage withstanding area 11b and the first polycrystalline silicon film 31 of the low voltage withstanding area 11c are simultaneously removed. Next, the third resist pattern 23 and the first polycrystalline silicon film 31 are used as masks, and, for example, boron 32 is implanted to the p type silicon substrate 11 of the low voltage withstanding area 11c in a state that an acceleration voltage is 20 keV and an amount of dose is about $1 \times 10^{12}$ $cm^{-2}$.

The above-mentioned second embodiment can obtain the same advantage as the first embodiment.

Moreover, the thickness of the first polycrystalline silicon film 31 is formed to be thicker than that of the case of the first embodiment. Due to this, in ion-implanting boron 32 in the state that the third resist pattern 23 and the first polycrystalline silicon film 31 of the high voltage withstanding area 11b are used as masks, there does not occur a case in which impurity material, that is, boron 32 is partially passed through the first polycrystalline silicon film 31 and reaches to the p type silicon substrate 11 of the high voltage withstanding area 11b. Therefore, it is possible to prevent variation of the threshold value of the transistor of the high voltage withstanding area 11b generated when the impurity material is implanted to the p type silicon substrate 11 of the high voltage withstanding area 11b.

FIGS. 1, 2, 21 to 27 are cross sectional views showing a method for manufacturing a nonvolatile semiconductor memory device of a third embodiment of the present invention. The same reference numerals are added to the portions common to the first embodiment, and only the different portions will be explained.

Figure 21:
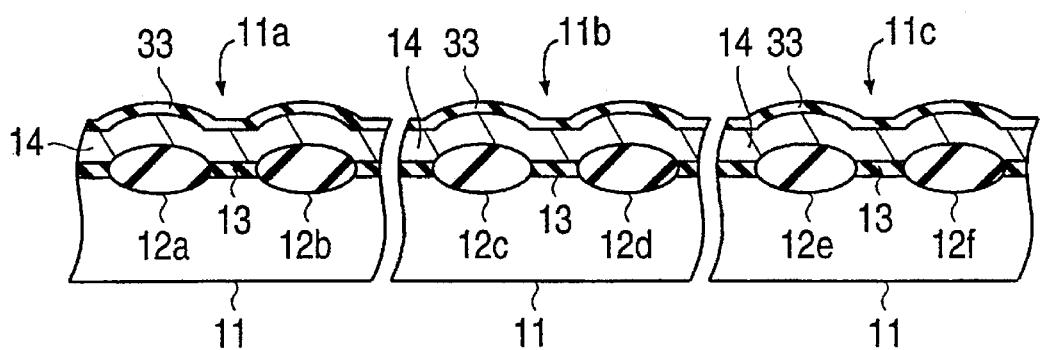
FIG. 21 shows a method for manufacturing a nonvolatile semiconductor memory device of the third embodiment of the present invention, and is a cross sectional view showing a process next to FIG. 2.

After the process shown in FIGS. 1 and 2, as shown in FIG. 21, a silicon oxide film 33 having a thickness of about 200 angstroms is formed on the first polycrystalline silicon film 14 by LPCVD.

Figure 22:
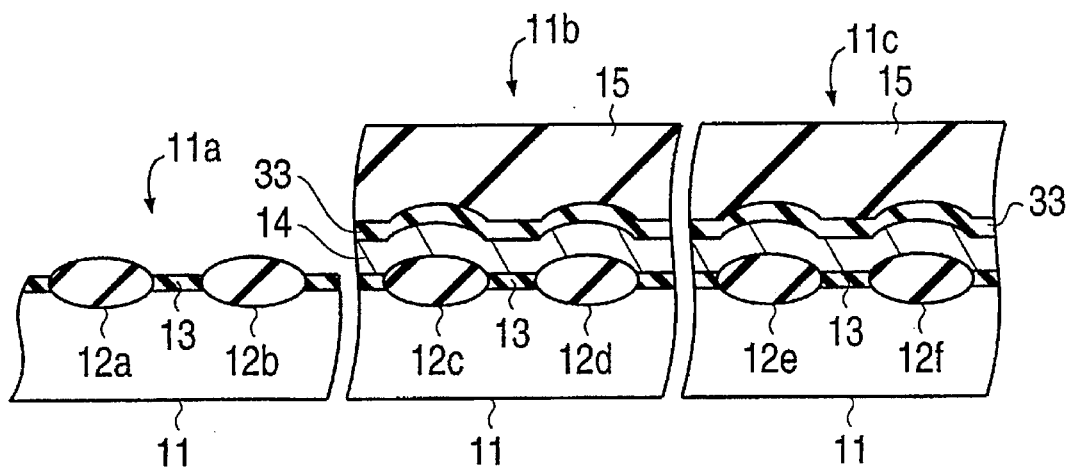
FIG. 22 shows a method for manufacturing a nonvolatile semiconductor memory device of the third embodiment of the present invention, and is a cross sectional view showing a process next to FIG. 21.

Next, a first resist pattern 15 as shown in FIG. 22 is formed on the silicon oxide film 33 by lithography, and the resist is positioned on each of the high voltage withstanding area 11b and the low voltage withstanding area 11c. Thereafter, the first resist pattern is used as a mask to perform etching, thereby removing the silicon oxide film 33 of the cell area 11a. Next, the first resist pattern is used as a mask to perform etching, thereby removing the first polycrystalline silicon film 14 of the cell area 11a.

Figure 23:
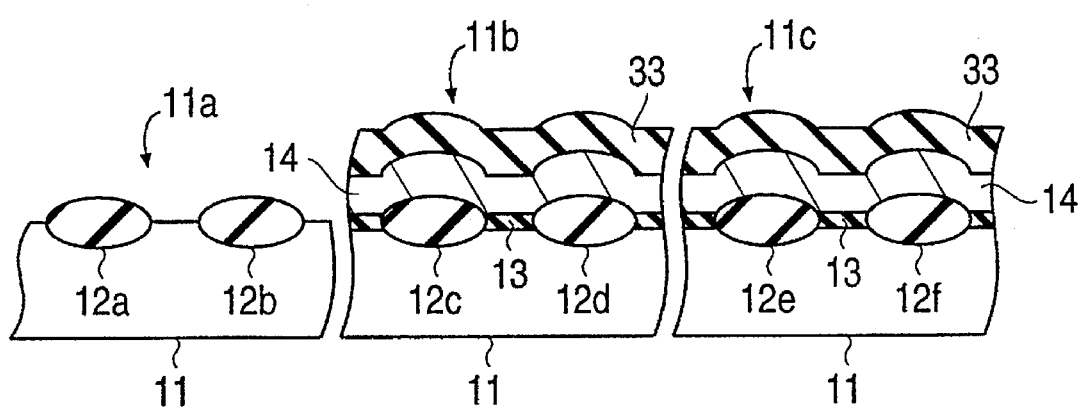
FIG. 23 shows a method for manufacturing a nonvolatile semiconductor memory device of the third embodiment of the present invention, and is a cross sectional view showing a process next to FIG. 22.

Next, as shown in FIG. 23, the first resist pattern 15 is removed. Thereafter, the silicon oxide film 13 is removed from the cell area 11a by etching using $NH_4F$, thereby exposing a surface of the p type silicon substrate 11.

Figure 24:
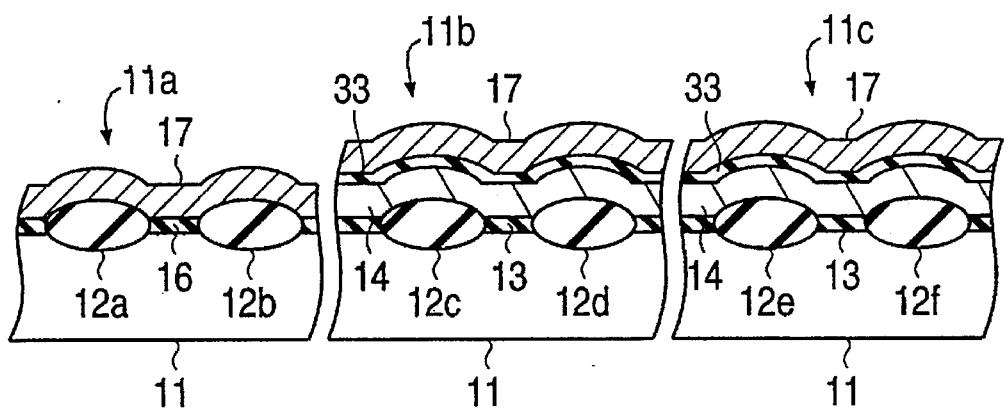
FIG. 24 shows a method for manufacturing a nonvolatile semiconductor memory device of the third embodiment of the present invention, and is a cross sectional view showing a process next to FIG. 23.

Thereafter, as shown in FIG. 24, an oxide-nitride film 16 having a thickness of about 100 angstroms to serve as a gate insulating film of the cell area 11a is formed on the surface of the exposed p type silicon substrate 11. Then, a second polycrystalline silicon film 17 having a thickness of about 1000 angstroms to serve as a floating gate of the cell area 11a is deposited on the oxide-nitride films 16 and the silicon oxide film 33, and the first and second element separation insulating films 12a and 12b. Thereafter, phosphorus is doped to the second polycrystalline silicon film 17 by phosphorus diffusion.

Figure 25:
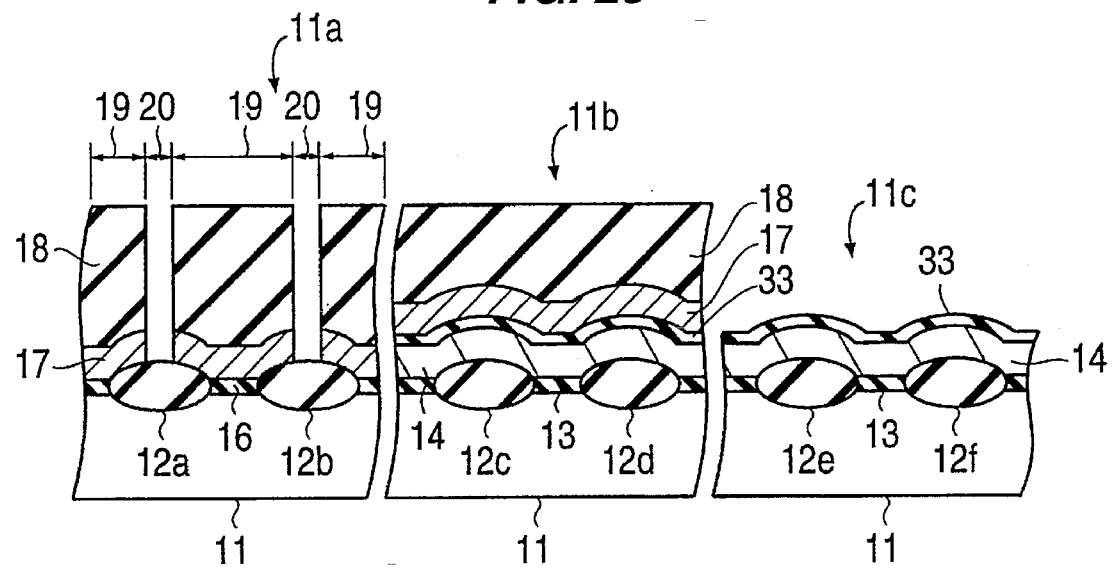
FIG. 25 shows a method for manufacturing a nonvolatile semiconductor memory device of the third embodiment of the present invention and is a cross sectional view showing a process next to FIG. 24.

Then, as shown in FIG. 25, a second resist pattern 18 is formed on the second polycrystalline silicon film 17. The second resist pattern 18 is positioned at an area 19 where the floating gate of the cell transistor is formed and on the high voltage withstanding area 11b. Thereafter, the second resist pattern 18 is used as a mask to perform etching whereby the second polycrystalline silicon film 17 on each of a floating gate separation area 20 of the cell area 11a and the low voltage withstanding area 11c is removed.

Figure 26:
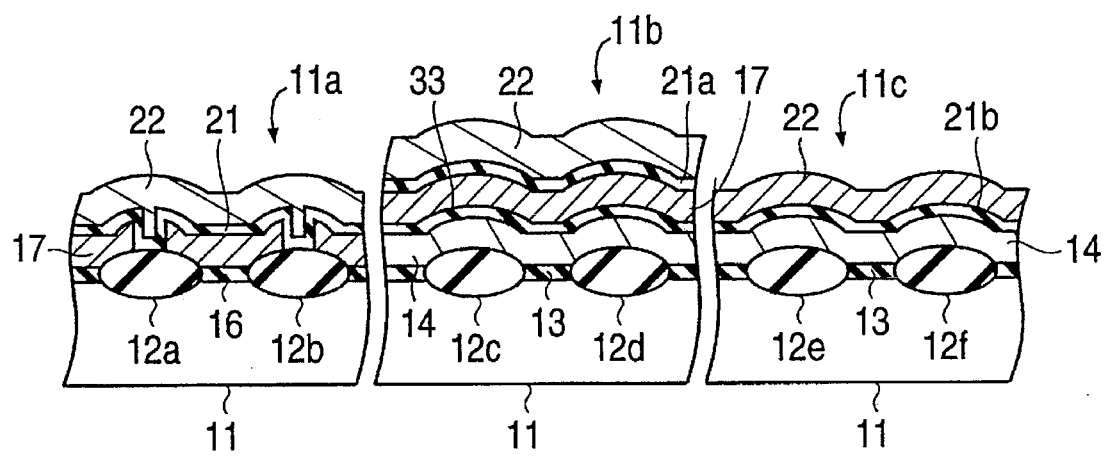
FIG. 26 shows a method for manufacturing a nonvolatile semiconductor memory device of the third embodiment of the present invention, and is a cross sectional view showing a process next to FIG. 25.

Thereafter, as shown in FIG. 26, the second resist pattern 18 is removed. Then, as an insulating film between the floating gate of the cell transistor and a control gate, for example, an ONO (oxide-nitride-oxide) layer film 21 is formed on the second polycrystalline silicon film 17 of the cell area 11a. At this time, an ONO layer film 21a is formed on the second polycrystalline silicon film 17 of the high voltage withstanding area 11b, and an ONO layer film 21b is formed on the first polycrystalline silicon film 14 of the low voltage withstanding area 11c. Thereafter, a third polycrystalline silicon film 22 having a thickness about 1000 angstroms is deposited on the ONO layer films 21, 21a and 21b.

Figure 27:
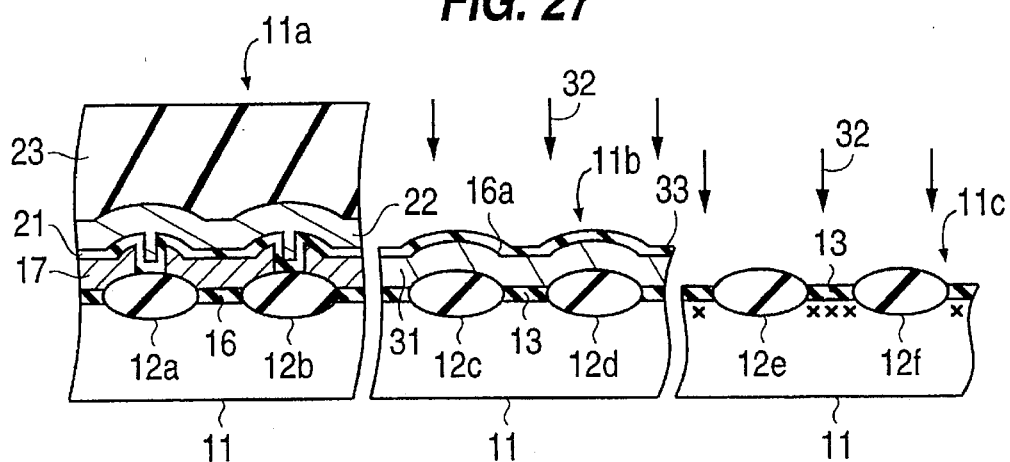
FIG. 27 shows a method for manufacturing a nonvolatile semiconductor device of the third embodiment of the present invention, and is a cross sectional view showing a process next to FIG. 26.
Figure 28:
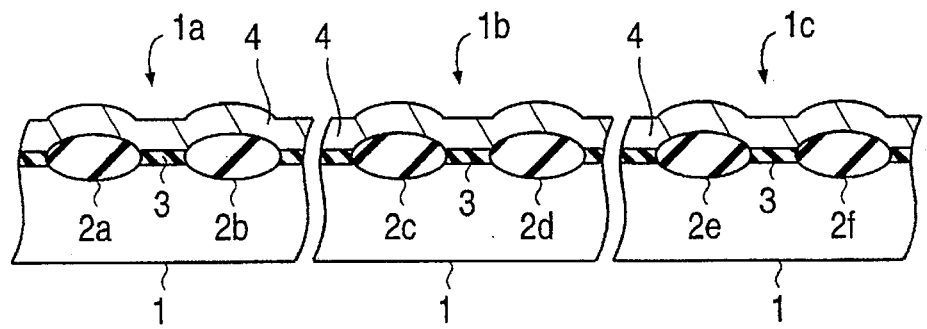
FIG. 28 is a cross sectional view showing a conventional method for manufacturing a nonvolatile semiconductor memory device.
Figure 29:
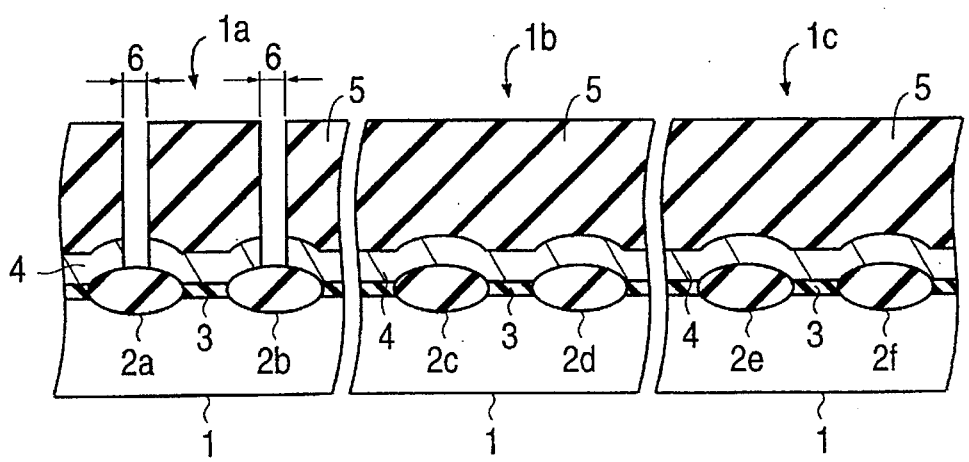
FIG. 29 shows a conventional method for manufacturing a nonvolatile semiconductor memory device, and is a cross sectional view showing a process next to FIG. 28.
Figure 30:
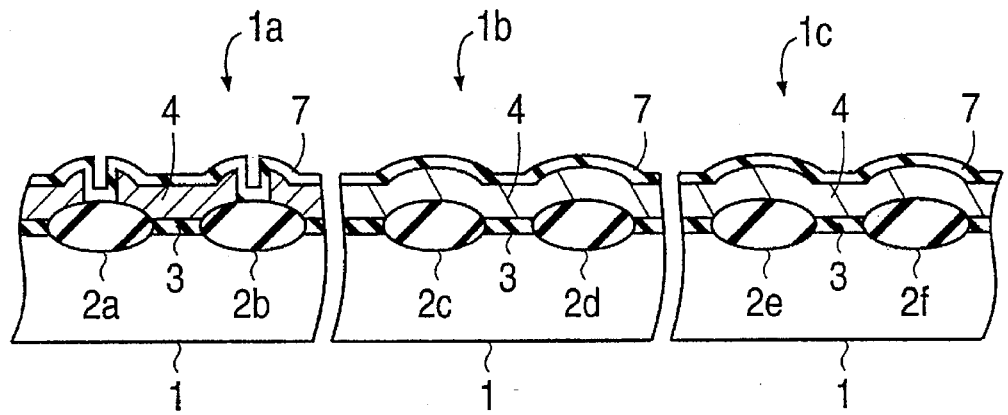
FIG. 30 shows a conventional method for manufacturing a nonvolatile semiconductor memory device, and is a cross sectional view showing a process next to FIG. 29.
Figure 31:
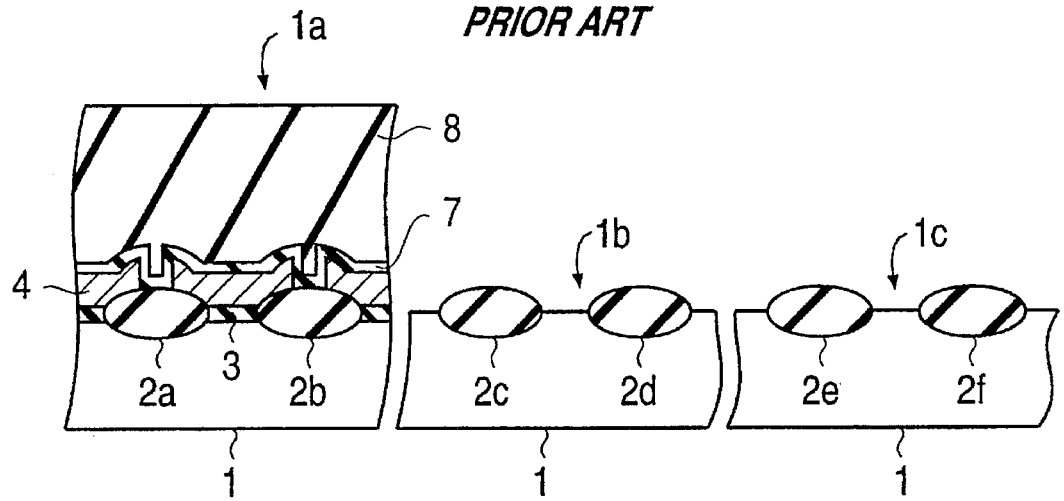
FIG. 31 shows a conventional method for manufacturing a nonvolatile semiconductor memory device, and is a cross sectional view showing a process next to FIG. 30.

Next, as shown in FIG. 27, a third resist pattern 23 is formed on a third polycrystalline silicon film 22 of the cell area 11a. Thereafter, the resist pattern 23 is used as a mask to perform isotropic etching, so that the third polycrystalline silicon films 22 of the high voltage withstanding area 11b and the low voltage withstanding area 11c are simultaneously removed.

Next, the third resist pattern 23 is used as a mask to perform anisotropic etching, thereby removing the ONO layer films 21a and 21b. Thereafter, the resist pattern 23 is used as a mask to perform etching, so that the second polycrystalline silicon film 17 of the high voltage withstanding area 11b and the first polycrystalline silicon film 14 of the low voltage withstanding area 11c are simultaneously removed.

Next, the third resist pattern 23, the first polycrystalline silicon film 31, and the silicon oxide film 33 having a thickness of about 200 angstroms are used as masks, and impurity material is introduced to the p type silicon substrate 11 of the low voltage withstanding area 11c.

The above-mentioned third embodiment can obtain the same advantage as the second embodiment.

Figure 32:
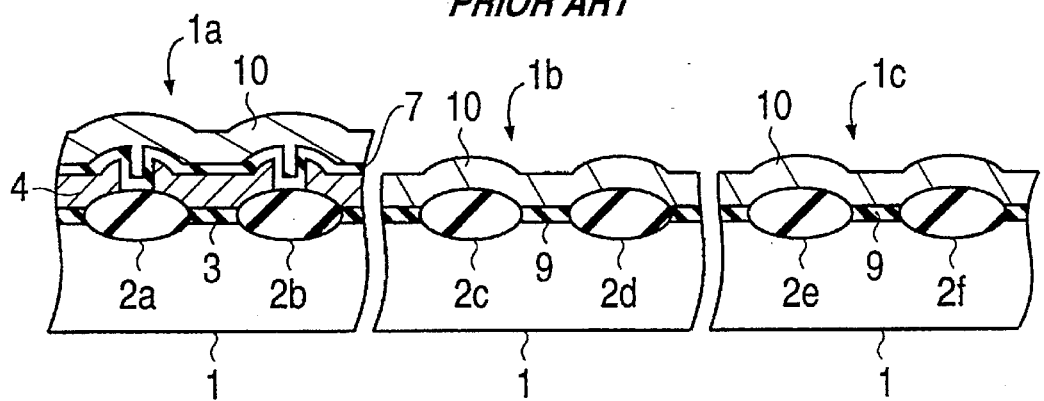
FIG. 32 shows a conventional method for manufacturing a nonvolatile semiconductor memory device, and is a cross sectional view showing a process next to FIG. 31.

In other words, in the process shown in FIG. 32, both first polycrystalline silicon film 14 and silicon oxide film 33 are used to introduce impurity material to the p type silicon substrate 11 of the low voltage withstanding area 11c. Due to this, impurity material can be prevented from being partially passed through the first polycrystalline silicon film 14. As a result, impurity material can be prevented from being implanted to the p type silicon substrate 11 of the high voltage withstanding area 11b.

It is apparent that, in this invention, a wide range of different working modes can be formed based on the invention without deviating from the spirit and scope of the invention. This invention is not restricted by its specific working modes except being limited by the appended claims.

What is claimed is:

1. A method for manufacturing a nonvolatile semiconductor memory device, comprising the steps of:

(1) forming, on a surface of a semiconductor substrate, a first element separation insulating film for separating a first area forming a first MOS transistor where a first power voltage is applied, a second element separation insulating film for separating a second area forming a second MOS transistor where a second power voltage higher than the first power voltage is applied, and a third element separation insulating film for separating a third area forming a memory cell transistor;

(2) forming a first oxide film on the surface of the semiconductor substrate;

(3) depositing a first polycrystalline silicon film on the first oxide film and the first to third element separation insulating films;

(4) forming a first resist pattern on the first polycrystalline silicon film covering the first and second areas;

(5) etching the first polycrystalline silicon film from the third area using the first resist pattern as a mask;

(6) removing the first oxide film from the third area;

(7) forming a second oxide film on the surface of the semiconductor substrate;

(8) depositing a second polycrystalline silicon film on the second oxide film;

(9) doping the second polycrystalline silicon film with an impurity;

(10) forming a second resist pattern on the second polycrystalline silicon film;

(11) removing the second polycrystalline film from the first area and from portions of the third area using the second resist pattern as a mask;

(12) removing the second resist pattern;

(13) forming a third oxide film on the second polycrystalline silicon film;

(14) depositing a third polycrystalline silicon film on the third oxide film;

(15) forming a third resist pattern on the third area;

(16) removing the third polycrystalline silicon film from the first and second areas using the third resist pattern as a mask; and

(17) forming additional layers on the structure resulting from step (16).

2. The method of claim 1, wherein step (17) comprises the steps of:

(a) removing the third oxide film from the first and second areas using the third resist pattern as a mask;

(b) removing the second polycrystalline silicon film from the first and second areas using the third resist pattern as a mask; and (c) implanting an impurity into the first area using the third resist pattern as a mask.

3. The method of claim 1, wherein step (3) comprises the step of depositing film having a thickness of about 1200 angstroms, and wherein step (8) comprises the step of depositing film having a thickness of about 1000 angstroms.

4. The method of claim 1, wherein step (7) comprises the step of using an oxide-nitride film.

5. A method for manufacturing a nonvolatile semiconductor memory device, comprising the steps of:

(1) forming, on a surface of a semiconductor substrate, a first element separation insulating film for separating a first area forming a first MOS transistor where a first power voltage is applied, a second element separation insulating film for separating a second area forming a second MOS transistor where a second power voltage higher than the first power voltage is applied, and a third element separation insulating film for separating a third area forming a memory cell transistor;

(2) forming a first oxide film on the surface of the semiconductor substrate;

(3) depositing a first polycrystalline silicon film on the first oxide film and the first to third element separation insulating films;

(4) forming a second oxide film on the first polycrystalline silicon film;

(5) forming a first resist pattern on the second oxide film covering the first and second areas;

(6) etching the first polycrystalline silicon film and the second oxide film from the third area using the first resist pattern as a mask;

(7) removing the first oxide film from the third area;

(8) forming a third oxide film on the surface of the semiconductor substrate;

(9) depositing a second polycrystalline silicon film on the third oxide film;

(10) adding an impurity to the second polycrystalline silicon film; and

(11) forming additional layers on the structure resulting from step (10).

6. The method of claim 5, wherein step (11) comprises the steps of:

(a) forming a second resist pattern on the second polycrystalline silicon film covering the second area and portions of the third area;

(b) etching the second polycrystalline silicon film from the first area and portions of the third area using the second resist pattern as a mask; and (c) forming a fourth oxide film on the second polycrystalline silicon film in the third area.

7. The method of claim 5, wherein step (4) comprises the step of forming a film having a thickness of about 200 angstroms.

8. The method of claim 5, wherein step (8) comprises the step of using an oxide-nitride-oxide film.

9. A method for manufacturing a nonvolatile semiconductor memory device comprising the steps of:

(1) forming, on a surface of a semiconductor substrate, a first element separation insulating film for separating a first area forming a first MOS transistor where a first power voltage is applied, a second element separation insulating film for separating a second forming a second MOS transistor where a second power voltage higher than the first power voltage is applied, and a third element separation insulating film for separating a third area forming a memory cell transistor;

(2) forming a first oxide film, serving as a gate insulating film of the second MOS transistor, on the surface of the semiconductor substrate;

(3) depositing a first polycrystalline silicon film on the first oxide film and the first to third element separation insulating films;

(4) forming a first resist pattern on the first polycrystalline silicon film over each of the first and second areas;

(5) etching the first polycrystalline silicon film from the third area using the first resist pattern as a mask;

(6) removing the first oxide film from the third area;

(7) forming a second oxide film, serving as a gate insulating film of the memory cell transistor, on a surface of the semiconductor substrate on the third area;

(8) depositing a second polycrystalline silicon film, serving as a floating gate of the memory cell transistor, on the second oxide film;

(9) introducing impurity material into the second polycrystalline silicon film;

(10) forming a second resist pattern on the second polycrystalline film on the third area where a floating gate electrode is formed and on the second area;

(11) etching the second polycrystalline silicon film using the second resist pattern as a mask;

(12) forming a first insulating film, serving as an insulating film between a floating gate of the memory cell transistor and a control gate, on the second polycrystalline silicon film after separating the second resist pattern;

(13) depositing a third polycrystalline silicon film on the first insulating film;

(14) forming a third resist pattern on the third polycrystalline silicon film on the third area;

(15) etching the third polycrystalline silicon film from the first and second areas using the third resist pattern as a mask;

(16) etching the first insulating film from the first and second areas using the third resist pattern as a mask;

(17) etching the first polycrystalline silicon film from the first area and the second polycrystalline silicon film from the second area using the third resist pattern as a mask;

(18) etching the first oxide film from the first area;

(19) forming a third oxide film, serving as a gate insulating film of the first MOS transistor, on a surface of the semiconductor substrate on the first area, on a surface of the first polycrystalline silicon film on the second area and on a surface of the third polycrystalline silicon film on the third area;

(20) depositing a fourth polycrystalline silicon film on the third oxide film;

(21) forming a fourth resist pattern on the fourth polycrystalline silicon film on the first area;

(22) etching the fourth polycrystalline silicon film using the fourth resist pattern as a mask; and

(23) depositing a fifth polycrystalline silicon film on the first to third areas.

10. A method of manufacturing a nonvolatile semiconductor memory device according to claim 9, further comprising a step of simultaneously introducing impurity material to the fifth polycrystalline silicon film, the fourth polycrystalline silicon film of the first area, the first polycrystalline silicon film of the second area, respectively after step (23) of depositing a fifth polycrystalline silicon film.

11. A method for manufacturing a nonvolatile semiconductor memory device comprising the steps of:

(1) forming, on a surface of a semiconductor substrate, a first element separation insulating film for separating a first area forming a first MOS transistor where a first power voltage is applied, a second element separation insulating film for separating a second area forming a second MOS transistor where a second power voltage higher than the first power voltage is applied, and a third element separating insulating film for separating a third area forming a memory cell transistor;

(2) forming a first oxide film, serving as a gate insulating film of the second MOS transistor, on a surface of the semiconductor substrate;

(3) depositing a first polycrystalline silicon film on the first oxide film and the first to third element separation insulating films;

(4) forming a first resist pattern on the first oxide film on each of the first and second areas;

(5) etching the first polycrystalline silicon film using the first resist pattern as a mask;

(6) removing the first oxide film from the third area;

(7) forming a second oxide film, serving as a gate insulating film of the memory cell transistor, on a surface of the semiconductor substrate on the third area;

(8) depositing a second polycrystalline silicon film, serving as a floating gate of the memory cell transistor, on the second oxide film;

(9) introducing impurity material into the second polycrystalline silicon film;

(10) forming a second resist pattern on the second polycrystalline silicon film on the third area where a floating gate electrode is formed, and on the second area;

(11) etching the second polycrystalline silicon film using the second resist pattern as a mask;

(12) forming a first insulating film, serving as an insulating film between a floating gate of the memory cell transistor and a control gate, on the second polycrystalline silicon film after separating the second resist pattern;

(13) depositing a third polycrystalline silicon film on the first insulating film;

(14) forming a third resist pattern on the third polycrystalline silicon film on the third area;

(15) etching the third polycrystalline silicon film from the first and second areas using the third resist pattern as a mask;

(16) etching the first insulating film from the first and second areas using the third resist pattern as a mask;

(17) etching the first polycrystalline silicon film from the first area and the second polycrystalline silicon film from the second area using the third resist pattern as a mask; and

(18) implanting a dopant using the third resist pattern as a mask.

12. A method of manufacturing a nonvolatile semiconductor memory device according to claim 11, wherein step (3) comprises the step of depositing film to a thickness of more than 1200 angstroms.

13. A method of manufacturing a nonvolatile semiconductor memory device according to claim 11, wherein step (8) comprises the step of making the thickness of the second polycrystalline silicon film thinner than the thickness of the first polycrystalline silicon film; and wherein step (13) comprises the step of making the thickness of the third polycrystalline film thinner than the thickness of the first polycrystalline silicon film.

14. A method for manufacturing a nonvolatile semiconductor memory device comprising the steps of:

(1) forming, on a surface of a semiconductor substrate, a first element separation insulating film for separating a first area forming a first MOS transistor where a first power voltage is applied, a second element separation insulating film for separating a second area forming a second MOS transistor where a second power voltage higher than the first power voltage is applied and a third element separation insulating film for separating a third area forming a memory cell transistor;

(2) forming a first oxide film, serving as a gate insulating film of the second MOS transistor, on a surface of the semiconductor substrate;

(3) depositing a first polycrystalline silicon film on the first oxide film and the first to third element separation insulating films;

(4) forming a second oxide film on the first polycrystalline silicon film;

(5) forming a first resist pattern on the second oxide film on each of the first and second areas;

(6) etching the second oxide film and the first polycrystalline silicon film using the first resist pattern as a mask;

(7) removing the first oxide film from the third area;

(8) forming a third oxide film, serving as a gate insulating film of the memory cell transistor, on a surface of the semiconductor substrate on the third area;

(9) depositing a second polycrystalline silicon film, serving as a floating gate of the memory cell transistor, on the third oxide film;

(10) introducing impurity material into the second polycrystalline silicon film;

(11) forming a second resist pattern on the second polycrystalline silicon film on the third area where a floating gate electrode is formed and on the second area;

(12) etching the second polycrystalline silicon film using the second resist pattern as a mask;

(13) forming a first insulating film, serving as an insulating film between the floating gate of the memory cell transistor and a control gate, on the second polycrystalline silicon film after separating the second resist pattern;

(14) depositing a third polycrystalline silicon film on the first insulating film;

(15) forming a third resist pattern on the third polycrystalline silicon film on the third area;

(16) etching the third polycrystalline silicon film from the first and second areas using the third resist pattern as a mask;

(17) etching the first insulating film of the first and second areas using the third resist pattern as a mask;

(18) etching the first polycrystalline silicon film from the first area and the second polycrystalline silicon film from the second area using the third resist pattern as a mask; and

(19) introducing impurity material into the semiconductor substrate using the third resist pattern, the oxide film of the second area, and the first polycrystalline silicon film as masks.

* * * * *